United States Patent
Reitsma

(10) Patent No.: US 9,966,949 B2
(45) Date of Patent: May 8, 2018

(54) RESONANT INDUCTIVE SENSING WITH NEGATIVE IMPEDANCE TUNING

(71) Applicant: Texas Instruments Incorporated, Dallas, TX (US)

(72) Inventor: George P. Reitsma, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 148 days.

(21) Appl. No.: 14/990,782

(22) Filed: Jan. 7, 2016

(65) Prior Publication Data

US 2016/0195598 A1   Jul. 7, 2016

Related U.S. Application Data

(60) Provisional application No. 62/100,477, filed on Jan. 7, 2015.

(51) Int. Cl.
*H03K 17/95* (2006.01)
*G01B 7/02* (2006.01)

(52) U.S. Cl.
CPC ......... *H03K 17/9547* (2013.01); *G01B 7/023* (2013.01)

(58) Field of Classification Search
USPC ........................ 324/601, 633, 655; 327/568
See application file for complete search history.

(56) References Cited

U.S. PATENT DOCUMENTS

| | | | | |
|---|---|---|---|---|
| 5,388,458 A | * | 2/1995 | Weinberg | G01C 19/5607 310/329 |
| 2014/0375600 A1 | * | 12/2014 | Pan | G06F 3/0418 345/174 |
| 2015/0077094 A1 | * | 3/2015 | Baldwin | G01B 7/003 324/207.17 |

* cited by examiner

*Primary Examiner* — Vincent Q Nguyen
(74) *Attorney, Agent, or Firm* — Andrew Viger; Charles A. Brill; Frank D. Cimino

(57) ABSTRACT

A resonant inductive sensing system includes a sensor resonator and an inductance-to-data converter (IDC) including an algorithmic control loop with operational and calibration phases. The resonator is characterized by a resonance state corresponding to a sensed condition. The IDC includes a negative impedance stage and a loop control stage. During the operation phase, the negative impedance stage drives the resonator with a selected (controlled) negative impedance. The loop control stage includes detection circuitry that detects resonance state, and range comparison circuitry that generates an out-of-range signal when the detected resonance state is not within a pre-defined range of resonance states. Algorithmic control circuitry is responsive to the out-of-range signal to transition the IDC to operation in the calibration phase, including determining an adjusted negative impedance corresponding to a resonance state within the pre-defined range of resonance states, and generating a negative impedance control signal based on the adjusted negative impedance.

20 Claims, 3 Drawing Sheets

RESONANT INDUCTIVE SENSING WITH NEGATIVE IMPEDANCE TUNING

CROSS-REFERENCE TO RELATED APPLICATIONS

Priority is claimed under 37 CFR 1.78 and 35 USC 119(e) to U.S. Provisional Application 62/100,477, filed 7 Jan. 2015, which is incorporated by reference.

BACKGROUND

Technical Field

This patent Disclosure relates generally to resonant inductive sensors and sensing, such as can be used in sensing position, proximity or physical state or condition.

Related Art

A resonant sensor includes a resonator configured for operation in a resonance state (resonant frequency and amplitude). Sensor electronics drives the resonator with an AC excitation current synchronized with resonator oscillation voltage to maintain resonance (sustained, steady-state oscillation), overcoming a resonator loss factor characterized by a resonator impedance. For example, in the case of inductive sensing, an LC resonator includes an inductive sensing coil that operated at resonance projects a magnetic sensing field, with resonator impedance (loss factor) characterized by a series resistance Rs or equivalent parallel impedance Rp.

Resonant sensing is based on measuring changes in resonance state (resonator oscillation amplitude and frequency) in response, for example, to a conductive target. For example, in case of inductive sensing with an LC resonator, resonance is affected by changes in projected magnetic flux energy output from the inductive sensing coil, such as caused by the eddy current effect associated with a conductive target. Sensor resonator response can be measured as changes in eddy current losses manifested as a change in resonator impedance (loss factor Rs/Rp), or as changes in sensor coil inductance (due to a change in eddy current back emf) manifested as a change in resonator frequency.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for resonant inductive sensing with an algorithmic control loop for tuning negative impedance to resonator impedance, such as can be used in resonant inductive sensing applications for sensing position, proximity or physical state or condition.

According to aspects of the Disclosure, the resonant inductive sensing system includes a sensor resonator and an inductance-to-data converter (IDC) configured for operation based on an algorithmic control loop including calibration and operation phases. The resonant sensor is characterized by a resonance state (resonator oscillation amplitude and frequency), and a resonator impedance (loss factor) that changes in response to a sensed condition.

The IDC includes negative impedance circuitry and loop control circuitry. The negative impedance circuitry is responsive to a negative impedance control signal, and drives, during the operation phase, current into the resonator with a selected negative impedance based on the negative impedance control signal, such that the sensor resonator operates at a pre-defined resonance state corresponding to sustained oscillation. The loop control circuitry includes resonance state detection circuitry, range comparison circuitry and algorithmic control circuitry. The detection circuitry detects resonance state of the sensor resonator, and generates a resonance-state signal corresponding to the detected resonance state. The range comparison circuitry is responsive to the resonance-state signal to generate an out-of-range signal when the detected resonance state is not within a pre-defined range of resonance states represented by first and second threshold values. The algorithmic control circuitry is responsive to the out-of-range signal, indicating that the detected resonance state is not within the pre-defined range of resonance states, to transition the IDC to operation in the calibration phase, including (a) determining an adjusted negative impedance corresponding to a resonance state within the pre-defined range of resonance states, and (b) generating the negative impedance control signal based on the adjusted negative impedance.

In other aspects of the Disclosure: (a) the negative impedance circuitry can comprise an operational transconductance amplifier (OTA), such as a Class-D OTA, with a selectable −gm negative impedance; (b) the detection circuitry can comprise amplitude detection circuitry that determines resonance state based on resonator oscillation integration, and generates a voltage Vamp corresponding to the resonance-state signal; and (c) the range comparison circuitry comprises first and second comparators configured to respectively compare Vamp with the first and second threshold values, and to respectively output a first out-of-range signal if Vamp is greater than the first threshold value, and a second out-of-range signal if Vamp is less than the second threshold value. In other aspects of the Disclosure, the algorithmic control circuitry determines the adjusted negative impedance based on one of: (a) an incremental search in which the negative impedance control signal corresponds to a high negative impedance and is incrementally reduced until resonance state is detected as within the pre-defined range of resonance states; and (b) a two-step search based on generating first and second negative impedance control signals corresponding respectively to a first negative impedance under which resonator oscillation amplitude increases relative to the first and second threshold levels, and a second negative impedance under which resonator oscillation amplitude decreases from the second threshold level to the first threshold level.

Other aspects and features of the invention claimed in this Patent Document will be apparent to those skilled in the art from the following Disclosure.

DETAILED DESCRIPTION

This Description and the Drawings constitute a Disclosure for resonant inductive sensing with an algorithmic control loop for tuning negative impedance to resonator impedance, including example embodiments that illustrate various technical features and advantages.

In brief overview, a resonant inductive sensing system includes a sensor resonator and an inductance-to-data converter (IDC) including an algorithmic control loop with operational and calibration phases. The resonator is characterized by a resonance state corresponding to a sensed condition. The IDC includes a negative impedance stage and a loop control stage. During the operation phase, the negative impedance stage drives the resonator with a selected (controlled) negative impedance. The loop control stage includes detection circuitry that detects resonance state, and range comparison circuitry that generates an out-of-range signal when the detected resonance state is not within a pre-defined range of resonance states. Algorithmic control circuitry is responsive to the out-of-range signal to transition the IDC to operation in the calibration phase, including determining an adjusted negative impedance corresponding to a resonance state within the pre-defined range of resonance states, and generating a negative impedance control signal based on the adjusted negative impedance.

Figure 1:
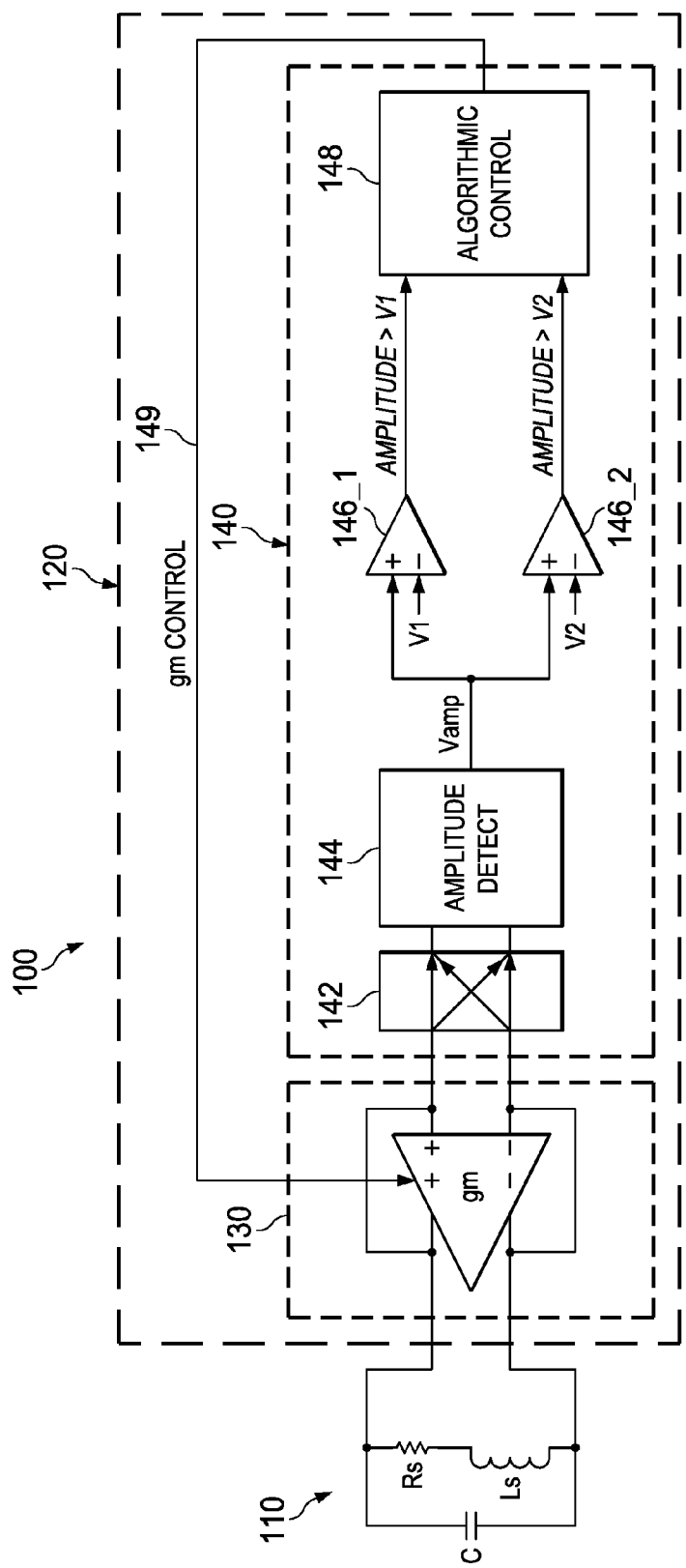
FIG. 1 illustrates an example embodiment of a resonant inductive sensing system (100) with an algorithmic control loop for tuning negative impedance to resonator impedance, including a sensor inductive resonator [110], and an inductance-to-data converter (120) with a negative impedance stage (130), and loop control stage (140), implementing an algorithmic control loop that provides algorithmic control of the negative impedance during calibration phases, instead of constant feedback control.

FIG. 1 illustrates an example embodiment of a resonant inductive sensing system 100 configured for operation based on an algorithmic control loop for tuning negative impedance to resonator impedance. Sensing system 100 includes a sensor inductive resonator 110, and an inductance-to-data converter (IDC) 120.

For resonant inductive sensing, IDC 120 is configured to acquire/capture sensor response measurements from sensor resonator 110, such as measurements corresponding to a sensed condition. Example applications include sensing position, proximity or state or physical condition of a conductive target. IDC 120 converts the sensor response measurements to data representative of the sensed conditions. For example, IDC 120 can be configured to convert sensor response measurements based on measured changes in eddy current losses manifested as a change in resonator impedance (loss factor Rs), or based on changes in sensor coil inductance (due to a change in eddy current back emf) manifested as a change in resonator frequency (for example, using a frequency counter). The operation of IDC 120 in capturing and converting sensor response measurements is not relevant to the present Disclosure of resonant inductive sensing with an algorithmic control loop for tuning negative impedance to resonator impedance, and for this reason is not illustrated or described in this Disclosure.

IDC 120 is configured to implement including an algorithmic control loop for tuning negative impedance to resonator impedance according to this Disclosure, including operational and calibration phases.

Sensor resonator 110 is illustrated as an LsC tank circuit. Resonator loss factor is represented by series resistance Rs.

Sensor resonator 110 (including resonator impedance Rs) can be characterized by a resonance state in which the resonator oscillates with sustained oscillation at a resonator oscillation frequency. and corresponding relative maximum (peak) resonator oscillation amplitude. Resonator resonance state can be represented by, for example, resonator oscillation integration (integration of the resonator oscillation signal), or resonator oscillation amplitude peak detection.

IDC 120 includes a negative impedance stage 130, and loop control stage 140. IDC 120 establishes an algorithmic control loop with operational and calibration phases. During operational phases, the IDC negative impedance stage 130 drives sensor resonator 110 (LsC) with a negative impedance tuned by the algorithmic control loop to balance sensor resonator impedance (Rs). During calibration phases, loop control stage 140 provides algorithmic control (gm control 149) of the negative impedance of negative impedance stage 130.

Algorithmic control according to this Disclosure is distinguished from control based on constant feedback (continuous or discrete). An IDC designed for constant (continuous or discrete) feedback loop control is disadvantageous for operation with a range of sensor designs and sensing applications. For example, sensor speed (time constant=Ls/Rs) can vary by 4 orders of magnitude (factor 10000), such that the control loop would have to be designed for the slowest type of sensor, limiting the performance of faster sensors. Also, resonance impedance can vary from a few hundred Ohm to 100K Ohms.

During the operational phase. negative impedance stage 130 drives current into sensor resonator 110 with a negative impedance (synchronized with resonator oscillation voltage). Negative impedance stage 130 is controlled to drive a negative impedance that balances resonator impedance (loss factor Rs) to maintain sustained (steady state) oscillation.

During the calibration phase, the algorithmic control loop effectively tunes negative impedance (gm control) to sensor resonator impedance (Rs), maintaining sustained oscillation. As a result, the negative impedance corresponds to (quantifies) sensor response to a sensed condition (such as proximity or position of a conductive target).

For the example embodiment, negative impedance stage 130 is implemented with an OTA (operational transconductance amplifier) 131, configured to drive sensor resonator 110 with a negative impedance (transconductance gm). OTA 131 is controlled so that negative impedance (−gm) balances (compensates for) the impedance of the sensor resonator (loss factor Rs) to maintain sustained (steady-state) oscillation. During calibration phases, the algorithmic control loop adjusts negative impedance (−gm) for changes in sensor resonator impedance during the operational phases (sensing operation).

For the example embodiment, loop control stage 140 implements the algorithmic control loop based on (a) resonance state detection using a full wave rectifier 142 followed by amplitude detection 144, and (b) algorithmic control (tuning) of negative impedance (−gm) using V1/V2 gm range comparators 146_1 and 146_2 providing V1/V2 gm range comparison results to an algorithmic control block 148 that implements negative impedance tuning during calibration phases.

For the example embodiment, the resonance state of sensor resonator 110 is determined based on resonator oscillation integration, which is referred to in this Disclosure as amplitude detection (in contrast to frequency detection).

Amplitude detection 144 can be implemented as an integrate and sample/dump filter, providing an amplitude output voltage Vamp.

Amplitude detection 144 integrates the full-wave rectified sinusoidal resonator oscillation signal for a quarter of the oscillation period, or a multiple of the quarter oscillation period. The resonator oscillation integration output from amplitude detection 144 characterizes resonator resonance state (resonator oscillation amplitude and resonator oscillation frequency).

In an alternative embodiment, resonator oscillation amplitude peak detection can be used to determine resonance state, such as with a half-wave rectifier followed by a low-pass filter. For most applications, detection based on resonator oscillation integration is the preferred approach because of less sensitivity to noise, and EMI. Half-wave rectification can also be used in connection with amplitude detection 144, although full-wave rectification is advantageous for noise reduction.

The Vamp output from amplitude detection 144, representing resonance state of sensor resonator 110, is input to V1/V2 gm range comparators 146_1 and 146_2. These comparators output a "1" if Vamp exceeds the reference voltages V1 and V2 respectively. The V1/V2 thresholds are chosen such that an optimal or desired operation is achieved if Vamp is between the reference levels V1 and V2.

The V1/V2 gm range comparison results (signals) from comparators 146_1 and 146_2 are input to algorithmic control block 148, which generates a gm control signal 149 provided to negative impedance stage 130. The gm control signal 149 is used to control negative impedance (−gm) of OTA 131.

Based on the V1/V2 gm range comparison results, algorithmic control block 148 implements algorithmic control of negative impedance according to this Disclosure. Algorithmic control block 148 effectively tunes operational negative impedance by tuning transconductance gm (gm control 149) to sensor impedance represented by the sensor resonance state detected by amplitude detection 144 (Vamp).

Based on the V1/V2 gm range comparison results derived from the sensor resonance state detected by amplitude detection 144, algorithmic control block 148 transitions the algorithmic control loop between calibration and operational phases. If Vamp is between V1 and V2 (V1<=Vamp<=V2), the algorithmic control loop (IDC 110) is in the operational phase, and OTA 131 drives sensor resonator 110 with a negative impedance (−gm) set by gm control 149 from algorithmic control block 148 (during the previous calibration phase). If Vamp is less than V1 or greater than V2, corresponding to an out-of-range condition, algorithmic control block 148 transitions the algorithmic control loop to the calibration phase, and provides gm control 149 to adjust OTA negative impedance (−gm).

During calibration phases, the algorithmic control loop determines an optimal (or desired) negative impedance (−gm) as a gm control level provided to OTA 131 (gm control 149) (corresponding to the detected resonance state being within the V1/V2 gm range). This (−gm) level is then frozen in OTA 131, and algorithmic control block 148 transitions IDC 120 to an operational phase. During operational phases, OTA 131 drives sensor resonator 110 with this (−gm) until Vamp is detected as out of the V1/V2 gm range (Vamp>V2 or Vamp<V1), corresponding to an out-of-range condition. Thus, in the operational phase, the sensing system 100 basically operates open loop, and control loop stability is maintained.

Calibration control algorithms suitable for implementing an algorithmic control loop according to this Disclosure, include: (1) incremental search; and (2) two-step search.

Incremental search. During the calibration phase, algorithmic control block 148 starts with gm control signal 149 at the highest setting, and waits Q periods of oscillation before verifying the sensor resonator response (Vamp), where Q equals the quality factor of the resonator [Q=sqrt (Ls/C)/Rs]. If Vamp is greater than V2, gm control 149 is decreased by one step, and after Q periods of oscillation the amplitude is verified again. This procedure is repeated until Vamp is less than V2. This approach can be slow, particularly for sensors with a high quality factor and low resonance frequency.

Figure 2:
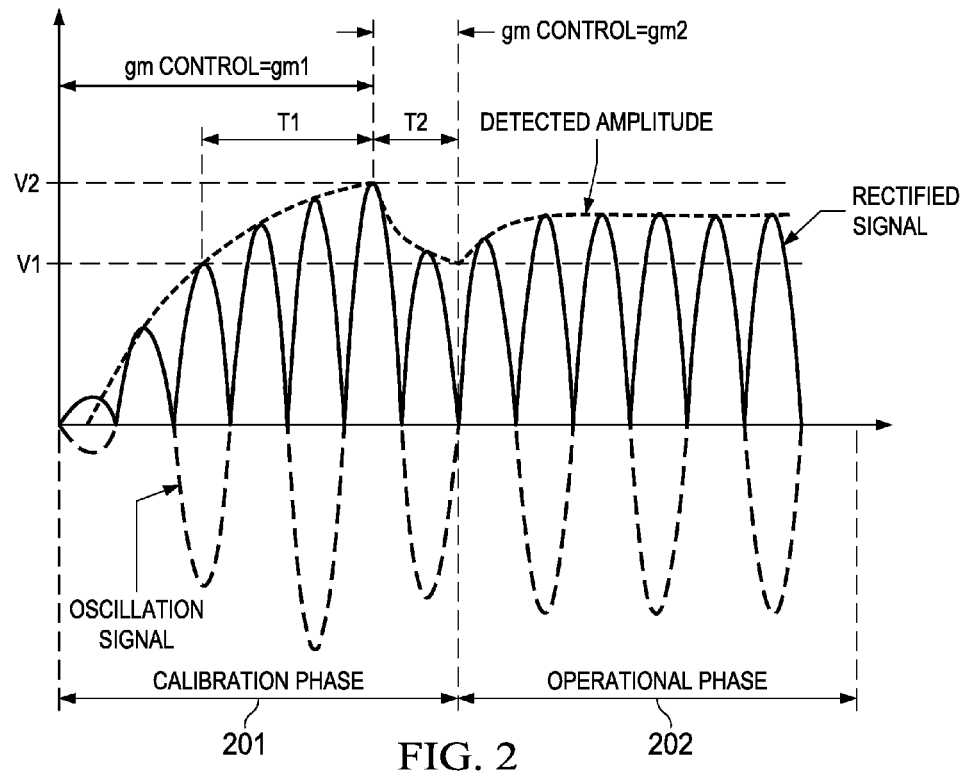
FIG. 2 provides example waveforms that illustrate resonator oscillation during an example calibration phase (201), and an example operational phase (202), where the calibration phase illustrates an example two step calibration search to generate an optimum negative impedance (gm_opt) for the negative impedance stage (FIG. 1, 130).

Two step search. FIG. 2 illustrates a two-step search algorithm for the algorithmic control loop to generate an optimum negative impedance (−gm_opt) for OTA 131, including a calibration phase 201, and an operational phase 202.

During the calibration phase, first a gm=gm1 is applied such that 1/gm1<(1/Rs*Ls/C). Under this condition, resonator oscillation signal amplitude rises, and algorithm control block 148 measures a time window T1, from when oscillation amplitude crosses V1 until it reaches V2. Once the amplitude reaches V2, a significantly smaller gm2 is applied such that 1/gm2>(1/Rs*Ls/C), where gm2 could even equal zero. Algorithm control block 148 measures a time window T2, which is the time it takes for the amplitude to decrease from V2 to V1. Based on the applied gm1/gm2 gm control signals (149), and time windows T1/T2, an optimal gm_opt can be calculated.

Example gm_opt calculations for two example transconductance amplifier configurations Class D OTA, and Class A OTA are:

$$gm\_opt=(T1*gm1+T2*gm2)/(T1+T2). \quad \text{Class D OTA:}$$

$$gm\_opt=(T1*gm1-T2*gm2)/(T2-T1). \quad \text{Class A OTA:}$$

The optimal gm_opt is applied to OTA 131, and used during operational phase of the algorithmic control loop.

In effect, the algorithmic control loop according to this Disclosure characterizes the sensor resonator by measuring rise time T1 and fall/decay time T2, from which the optimum negative impedance can be calculated. That is, rather than using feedback control to find an optimal negative impedance, the algorithmic control loop measures key sensor characteristics, and then calculates optimal negative impedance.

The FIG. 2 waveforms illustrating resonator oscillation during calibration and operational phases are for a Class D OTA. However, the principles illustrated are identical for other amplifier configurations including a Class A OTA.

Figure 3A:
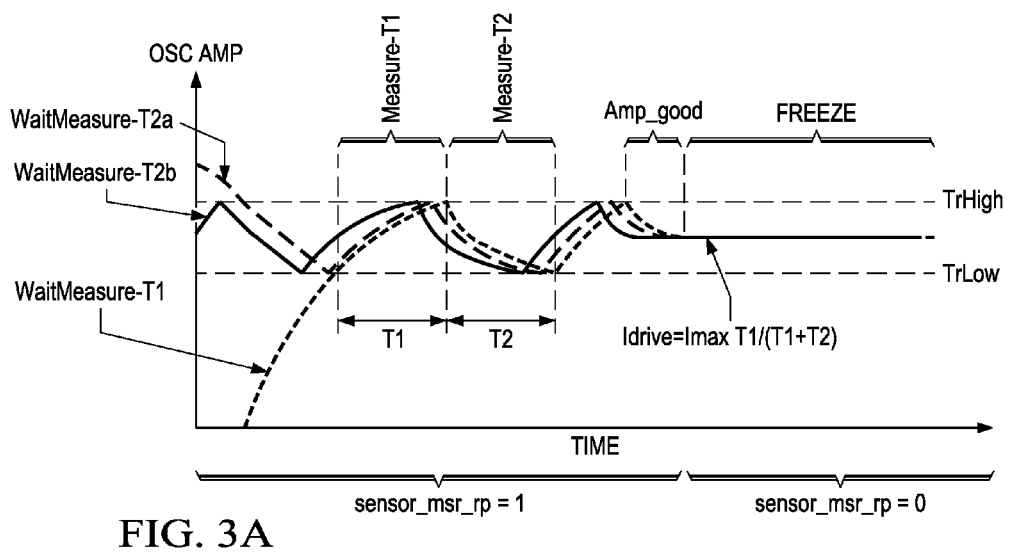
FIGS. 3A and 3B illustrate, for an example state machine implementation of an algorithmic control block in the loop control stage (FIG. 1, 140), an example state machine operation for the example calibration phase of FIG. 2 using the example two step calibration search for generating optimum negative impedance (gm_opt).
Figure 3B:
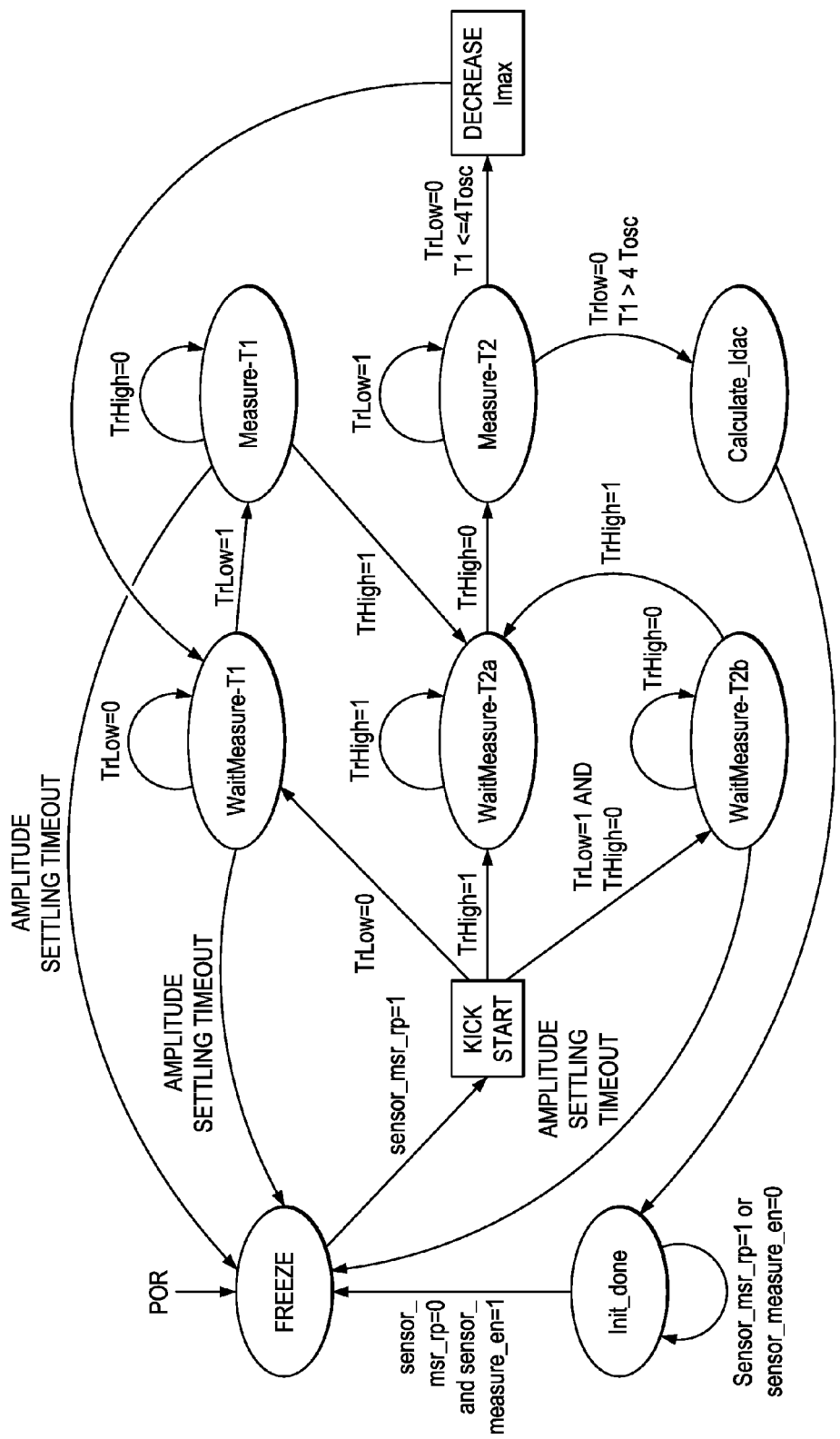

For the example embodiment, algorithmic control block 148 is implemented as a state machine. FIGS. 3A and 3B illustrate an example state machine operation for the calibration phase of FIG. 2, using the example two step calibration search for generating optimum negative impedance (gm_opt).

Advantages of the algorithmic control loop according to this Disclosure include relatively rapid settling time. A relatively high gm1 can be chosen in order to obtain a rapid increase in resonator oscillation amplitude to the V1/V2 calibration phase levels. In addition, the algorithmic control loop approach is inherently stable, since during operational phases, no feedback is required. Thus, the algorithmic control approach provides loop stability for a range of sensor designs without significantly limiting performance.

The Disclosure describes apparatus and methods for resonant inductive sensing with an algorithmic control loop for tuning negative impedance to resonator impedance, such as can be used in resonant inductive sensing applications for sensing position, proximity or physical state or condition.

In summary, the Disclosure describes a resonant inductive sensing system that includes a sensor resonator and an inductance-to-data converter (IDC) configured for operation based on an algorithmic control loop including calibration and operation phases. The resonant sensor is characterized by a resonance state (resonator oscillation amplitude and frequency), and a resonator impedance (loss factor) that changes in response to a sensed condition.

The IDC includes negative impedance circuitry and loop control circuitry. The negative impedance circuitry is responsive to a negative impedance control signal, and drives, during the operation phase, current into the resonator with a selected negative impedance based on the negative impedance control signal, such that the sensor resonator operates at a pre-defined resonance state corresponding to sustained oscillation. The loop control circuitry includes resonance state detection circuitry, range comparison circuitry and algorithmic control circuitry. The detection circuitry detects resonance state of the sensor resonator, and generates a resonance-state signal corresponding to the detected resonance state. The range comparison circuitry is responsive to the resonance-state signal to generate an out-of-range signal when the detected resonance state is not within a pre-defined range of resonance states represented by first and second threshold values. The algorithmic control circuitry is responsive to the out-of-range signal, indicating that the detected resonance state is not within the pre-defined range of resonance states, to transition the IDC to operation in the calibration phase, including (a) determining an adjusted negative impedance corresponding to a resonance state within the pre-defined range of resonance states, and (b) generating the negative impedance control signal based on the adjusted negative impedance.

In other aspects of the Disclosure: (a) the negative impedance circuitry can comprise an operational transconductance amplifier (OTA), such as a Class-D OTA, with a selectable −gm negative impedance; (b) the detection circuitry can comprise amplitude detection circuitry that determines resonance state based on resonator oscillation integration, and generates a voltage Vamp corresponding to the resonance-state signal; and (c) the range comparison circuitry comprises first and second comparators configured to respectively compare Vamp with the first and second threshold values, and to respectively output a first out-of-range signal if Vamp is greater than the first threshold value, and a second out-of-range signal if Vamp is less than the second threshold value. In other aspects of the Disclosure, the algorithmic control circuitry determines the adjusted negative impedance based on one of: (a) an incremental search in which the negative impedance control signal corresponds to a high negative impedance and is incrementally reduced until resonance state is detected as within the pre-defined range of resonance states; and (b) a two-step search based on generating first and second negative impedance control signals corresponding respectively to a first negative impedance under which resonator oscillation amplitude increases relative to the first and second threshold levels, and a second negative impedance under which resonator oscillation amplitude decreases from the second threshold level to the first threshold level.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A resonant inductive sensing system, comprising:
 a sensor resonator having a resonance state, and a resonator impedance that changes in response to a sensed condition;
 an inductance-to-data converter (IDC), including
  negative impedance circuitry to drive, during an operation phase, current into the sensor resonator based on a negative impedance corresponding to a pre-defined resonance state, the negative impedance set during a calibration phase by a negative impedance control signal; and
  calibration/operation control circuitry, including:
   detection circuitry to detect resonance state of the sensor resonator, and to generate a corresponding resonance-state signal;
   range comparison circuitry responsive to the resonance-state signal to generate an out-of-range signal when the detected resonance state is not within a pre-defined range of resonance states represented by first and second threshold values; and
   algorithmic control circuitry responsive to the out-of-range signal, to transition the IDC from the operation phase to the calibration phase, including
    to determine an adjusted negative impedance corresponding to a resonance state within the pre-defined range of resonance states, and
    to generate the negative impedance control signal based on the adjusted negative impedance.

2. The system of claim 1, wherein the negative impedance circuitry comprises an operational transconductance amplifier (OTA) with a settable −gm negative impedance.

3. The system of claim 2, wherein the OTA is a Class-D OTA.

4. The system of claim 1, wherein the detection circuitry comprises amplitude detection circuitry to determine resonance state based on resonator oscillation integration, and generate the resonance state signal.

5. The system of claim 1, wherein the range comparison circuitry comprises first and second comparators to respectively compare the resonance state signal with the first and second threshold values, and to respectively output a first out-of-range signal if the resonance state signal is greater than the first threshold value, and a second out-of-range signal if the resonance state signal is less than the second threshold value.

6. The system of claim 1, wherein the algorithmic control circuitry determines the adjusted negative impedance based on one of:
 an incremental search in which the negative impedance control signal corresponds to a high negative impedance and is incrementally reduced until resonance state is detected as within the pre-defined range of resonance states; and
 a two-step search based on generating first and second negative impedance control signals corresponding respectively to a first negative impedance under which resonator oscillation amplitude increases relative to the first and second threshold levels, and a second negative impedance under which resonator oscillation amplitude decreases from the second threshold level to the first threshold level.

7. The system of claim 1, wherein the pre-defined resonance state corresponds to sustained oscillation of the sensor resonator.

8. A circuit for use in a resonant inductive sensing system including a sensor resonator having a resonance state, and a resonator impedance that changes in response to a sensed condition, comprising:
   negative impedance circuitry to drive, during an operation phase, current into the sensor resonator based on a negative impedance corresponding to a pre-defined resonance state, the negative impedance set during a calibration phase by a negative impedance control signal; and
   calibration/operation control circuitry, including:
      detection circuitry to detect resonance state of the sensor resonator, and to generate a corresponding resonance-state signal;
      range comparison circuitry responsive to the resonance-state signal to generate an out-of-range signal when the detected resonance state is not within a pre-defined range of resonance states represented by first and second threshold values; and
      algorithmic control circuitry responsive to the out-of-range signal, to transition the IDC from the operation phase to the calibration phase, including
         to determine an adjusted negative impedance corresponding to a resonance state within the pre-defined range of resonance states, and
         to generate the negative impedance control signal based on the adjusted negative impedance.

9. The circuit of claim 8, wherein the negative impedance circuitry comprises an operational transconductance amplifier (OTA) with a settable –gm negative impedance.

10. The circuit of claim 9, wherein the OTA is a Class-D OTA.

11. The circuit of claim 8, wherein the detection circuitry comprises amplitude detection circuitry to determine resonance state based on resonator oscillation integration, and generate the resonance state signal.

12. The circuit of claim 8, wherein the range comparison circuitry comprises first and second comparators to respectively compare the resonance state signal with the first and second threshold values, and to respectively output a first out-of-range signal if the resonance state signal is greater than the first threshold value, and a second out-of-range signal if the resonance state signal is less than the second threshold value.

13. The circuit of claim 8, wherein the algorithmic control circuitry determines the adjusted negative impedance based on one of:
   an incremental search in which the negative impedance control signal corresponds to a high negative impedance and is incrementally reduced until resonance state is detected as within the pre-defined range of resonance states; and
   a two-step search based on generating first and second negative impedance control signals corresponding respectively to a first negative impedance under which resonator oscillation amplitude increases relative to the first and second threshold levels, and a second negative impedance under which resonator oscillation amplitude decreases from the second threshold level to the first threshold level.

14. The circuit of claim 8, wherein the pre-defined resonance state corresponds to sustained oscillation of the sensor resonator.

15. A method for use in resonant inductive sensing system with a sensor resonator having a resonance state, and a resonator impedance that changes in response to a sensed condition, comprising:
   driving, during an operation phase, current into the sensor resonator based on a negative impedance corresponding to a pre-defined resonance state;
   setting, during a calibration phase, the negative impedance; and
   detecting resonance state of the sensor resonator;
   detecting an out-of-range condition when the detected resonance state is not within a pre-defined range of resonance states represented by first and second threshold values; and
   responsive to detecting the out-of-range condition, transitioning from the operation phase to the calibration phase, including
      determining an adjusted negative impedance corresponding to a resonance state within the pre-defined range of resonance states, and
      setting negative impedance based on the adjusted negative impedance.

16. The method of claim 15, wherein the negative impedance is provided by an Class-D operational transconductance amplifier (OTA) with a settable –gm negative impedance.

17. The method of claim 15, wherein detecting resonance state is based on amplitude detection based on resonator oscillation integration.

18. The method of claim 15, wherein detecting the out-of-range condition is based on comparing the resonance state with the first and second threshold values, and detecting the out-of-range condition when the resonance state signal is greater than the first threshold value, and when the resonance state signal is less than the second threshold value.

19. The method of claim 15, wherein adjusted negative impedance is determined based on one of:
   an incremental search in which a high negative impedance is incrementally reduced until resonance state is detected as within the pre-defined range of resonance states; and
   a two-step search based on detecting a first negative impedance under which resonator oscillation amplitude increases relative to the first and second threshold levels, and a second negative impedance under which resonator oscillation amplitude decreases from the second threshold level to the first threshold level.

20. The method of claim 15, wherein the pre-defined resonance state corresponds to sustained oscillation of the sensor resonator.

* * * * *